United States Patent [19]
Konishi et al.

[11] Patent Number: 5,530,379
[45] Date of Patent: Jun. 25, 1996

[54] OUTPUT BUFFER CIRCUIT THAT CAN BE SHARED BY A PLURALITY OF INTERFACES AND A SEMICONDUCTOR DEVICE USING THE SAME

[75] Inventors: Yasuhiro Konishi; Takashi Araki; Hisashi Iwamoto, all of Hyogo, Japan

[73] Assignee: Mitsubishi Denki Kabushiki Kaisha, Tokyo, Japan

[21] Appl. No.: 427,186

[22] Filed: Apr. 21, 1995

[30] Foreign Application Priority Data

Apr. 27, 1994 [JP] Japan ................................. 6-089463

[51] Int. Cl.$^6$ ............................................. H03K 19/094
[52] U.S. Cl. ............................. 326/68; 326/63; 326/49
[58] Field of Search ............................. 326/63, 68, 69, 326/70, 71, 72, 73, 74, 75, 119, 121, 37, 49, 50

[56] References Cited

U.S. PATENT DOCUMENTS

| | | | |
|---|---|---|---|
| 4,223,277 | 9/1980 | Taylor et al. | 326/38 |
| 4,616,147 | 10/1986 | Pumo | 326/83 |
| 4,644,187 | 2/1987 | Haji | 326/44 |
| 5,059,835 | 10/1991 | Lauffar et al. | 326/50 |
| 5,298,807 | 3/1994 | Salmon et al. | 326/68 |
| 5,304,872 | 4/1994 | Avraham et al. | 326/68 |
| 5,450,027 | 9/1995 | Gabara | 326/121 |

FOREIGN PATENT DOCUMENTS 4-172015  6/1992  Japan .

OTHER PUBLICATIONS

"WP3.7: A CMOS Low∝Voltage–Swing Transmission–Line Transceiver", Bill Gunning et al., ISSCC 92, Session 3, High–Performance Circuits, pp. 58–59, Feb. 19, 1992.

*Primary Examiner*—Edward P. Westin
*Assistant Examiner*—Benjamin D. Driscoll
*Attorney, Agent, or Firm*—Lowe, Price, LeBlanc & Becker

[57] ABSTRACT

First and second transistors are connected via a first switch. Second and third transistors are connected in parallel via a second switch. Either an input signal or an output ground voltage is applied to the gate of a third transistor via a third switch. In a LVTTL version, the first switch is on and the second switch is off. By the third switch, the output ground voltage is applied to the gate of the third transistor. As a result, first and second, transistors are arranged in series between the output power supply voltage and the output ground voltage, resulting in an output buffer circuit corresponding to a LVTTL. In a GTL version, the first switch is off and the second switch is on. An input signal is applied to the gate of the third transistor by the third switch. As a result, second and third transistors are arranged in parallel to form an open drain. This can be used as an output buffer circuit corresponding to a GTL.

24 Claims, 7 Drawing Sheets

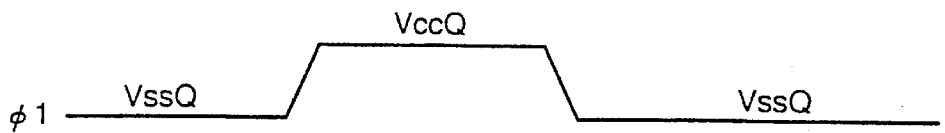
FIG. 11(a) PRIOR ART
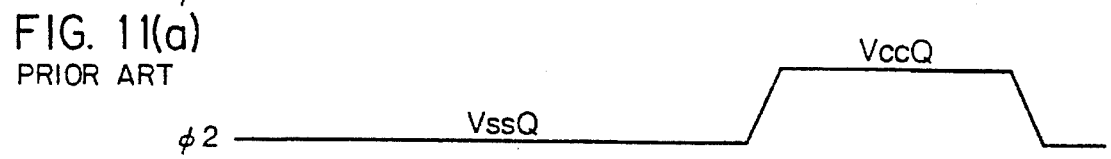
FIG. 11(b) PRIOR ART
FIG. 11(c) PRIOR ART
FIG. 12 PRIOR ART
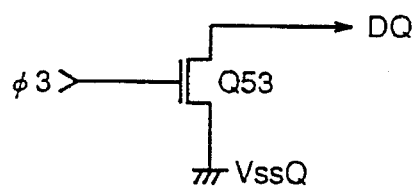
FIG. 13 PRIOR ART
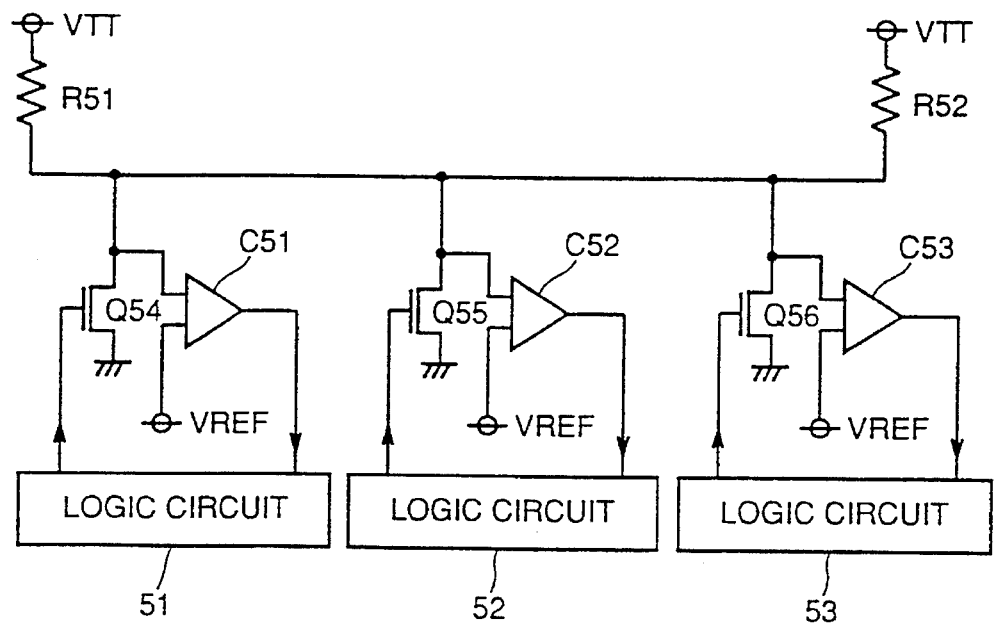

OUTPUT BUFFER CIRCUIT THAT CAN BE SHARED BY A PLURALITY OF INTERFACES AND A SEMICONDUCTOR DEVICE USING THE SAME

BACKGROUND OF THE INVENTION

1. Field of the Invention

The present invention relates to an output buffer circuit that can correspond to a plurality of interfaces. Particularly, the present invention relates to an output buffer circuit that is used in a memory integrated circuit device and the like.

2. Description of the Background Art

A TTL (Transistor-Transistor Logic) is mainly used as the interface standard for a semiconductor integrated circuit device employed as a memory. The TTL level is determined so that an input and output of at least 2.4 V correspond to logic "1", whereas an input of not more than 0.8 V and an output of not more than 0.4 V correspond to logic "0". However, in accordance with voltage reduction of the power source used in a semiconductor device (for example, 5.0V→3.3 V), a LVTTL (Low Voltage TTL) which is a voltage reduced version of TTL is also used. In a LVTTL, the signal level definition is divided into a determination level (AC specification) and a final level (DC specification) to which the signal arrives. It is determined that an input and output of at least 2.0 V correspond to logic "1" and an input and output not more than 0.8 V correspond to logic "0" in the AC specification. According to the DC specification, it is determined that an input and output of at least 2.4 V correspond to logic "1", and an input of not more than 0.8 V and an output of not more than 0.4 V correspond to logic "0".

A conventional output buffer circuit for a TTL and a LVTTL interface will be described hereinafter with reference to the drawings FIG. 10 is a circuit diagram showing a structure of a conventional TLL and LVTTL interface output buffer circuit.

Referring to FIG. 10, an output buffer circuit includes n channel MOS transistors Q51 and Q52 which are connected in series. Transistor Q51 has one end connected to an output power supply voltage $V_{cc}Q$. An input signal $\phi1$ is applied to the gate of transistor Q51. Transistor Q52 has one end connected to an output ground voltage $V_{ss}Q$. An input signal $\phi2$ is applied to the gate of transistor Q52. An output signal DQ is provided from the node of transistors Q51 and Q52.

The operation of an output buffer circuit of the above structure will be described hereinafter with reference to the timing chart of FIG. 11.

When input signals $\phi1$ and $\phi2$ attain the level of output ground voltage $v_{ss}Q$, transistors Q51 and Q52 are turned off, whereby output signal DQ attains a high resistance state (high impedance state). When input signal $\phi1$ attains the level of output power supply voltage $v_{cc}Q$ and input signal $\phi2$ attains the level of output ground voltage $v_{ss}Q$, transistor Q51 is turned on and transistor Q52 is turned off. As a result, output signal DQ attains a level of ($V_{cc}Q$-Vth), indicating logic "1". Here, Vth is the threshold voltage of transistor Q51. When input signal $\phi1$ attains the level of output ground voltage $V_{ss}Q$ and input signal $\phi2$ attains the level of output power supply voltage $v_{cc}Q$, transistor Q51 is turned off and transistor Q52 is turned on. As a result, output signal DQ attains a level of output ground voltage $v_{ss}Q$, indicating the state of logic "0". According to the above-described operation, output signal DQ is output in one of the three states according to the levels of input signals $\phi1$ and $\phi2$.

The need arises for increase of the operating speed of peripheral circuitry in accordance with increase in the operating frequency of recent microprocessors. Therefore, the operating speed of the above-described output buffer circuit for TTL/LVTTL interface is approaching the limit thereof. For example, there is a problem that the delay time in charging/discharging the load capacitance of approximately 100 pF to 2.4 V/0.4 V exceeds the required access time. There is also a problem that the output waveform is distorted due to overshooting, undershooting, ringing, and the like of the output signal caused by high speed switching, resulting in erroneous determination of the level. Therefore, a GTL (Gunnig Transceiver Logic) which is a high speed interface having a signal amplitude of not more than 1 V is recently used for an output buffer circuit. Such a GTL interface output buffer circuit will be described hereinafter. FIG. 12 is a circuit diagram showing a structure of a conventional GTL interface output buffer circuit.

Referring to FIG. 12, an output buffer circuit includes an open-drain n channel MOS transistor Q53. An input signal $\phi3$ is applied to the gate of transistor Q53. Transistor Q53 has one end connected to output ground voltage $V_{ss}Q$. Output signal DQ is provided from the drain of transistor Q53.

When input signal $\phi3$ attains an H level (logical high), transistor Q53 is turned on. As a result, output signal DQ of the level of output ground voltage $V_{ss}Q$ is provided, indicating the state of logic "0". When input signal $\phi3$ attains an L level (logical low), transistor Q53 is turned off, whereby output signal DQ attains a high impedance state.

A system employing the above-described output buffer circuit will be described hereinafter. FIG. 13 shows a structure of a system employing the output buffer circuit of FIG. 12.

Referring to FIG. 13, the system employing an output buffer circuit includes resistors R51, R52, n channel MOS transistors Q54–Q56, differential amplifiers C51–C53, and logic circuits 51–53. In FIG. 13, three logic circuits 51–53 are connected to the wiring terminated at a voltage VTT of 1.2 V via a resistor of 50Ω. The open-drain n channel MOS transistors Q54–Q56 serve as drivers, and differential amplifiers C51–C53 serve as receivers. Reference voltage VREF of 0.8 V is applied to one input terminal of each of differential amplifiers C51–C53. The drive current of transistors Q54–Q56 is approximately –40 mA.

When an output signal of logic "1" is provided from logic circuits 51–53, transistors Q54–Q56 are turned on. Here, a signal amplitude of less than 1 V is obtained due to a voltage drop caused by the drive current of transistors Q54–Q56 flowing to terminal resistors R51 and R52. When an output signal of logic "0" is provided from logic circuits 51–53, transistors Q54–Q56 are turned off. Therefore, the output signal attains the level of voltage VTT. Differential amplifiers C51–C53 compare-amplify the small voltage of the input signal with reference voltage VREF to apply the amplified signal to logic circuits 51–53.

According to the above-described GTL definition, the output level takes a value of not more than 0.4 V for logic "0" and a value of VTT=1.2 V for logic "1". In contrast, the input level takes a value of not more than VREF–50 (mV)=0.75 (V) for logic "0", and a value of at least VREF+50 (mV)=0.85 V for logic "1".

The advantage of the above-described GTL interface is set forth in the following. The impedance of the wiring, the terminal resistor, and the driver transistor is defined at the same level. Therefore, reflection of an output signal does not easily occur. Furthermore, the charge/discharge current does not increase in comparison with that of a TTL interface even when the load capacitor of the wiring is great since the signal amplitude is small.

The selection of a LVTTL or a GTL for the interface depends on, not only from the device side, but also on the target performance and the cost of the system employing a DRAM (Dynamic Random Access Memory). Particularly, the system may include a plurality of interfaces during its transition from a LVTTL to a GTL interface. Therefore, the device used in the system must include an output buffer circuit corresponding to the plurality of interfaces. This means that two types of output buffer circuits shown in FIGS. 10 and 12 must be provided within the device to correspond to both the LVTTL and the GTL interfaces.

When two types of output buffer circuits are to be provided as in the above-described case, the pull down ability of the transistor used in the GTL must be set greater than the pull down ability of the transistor of the LVTTL since the drive current of the GTL is defined at the level of 40 mA. For example, the gate width of transistors Q51 and Q52 used in the LVTTL must be 400 μm, and the gate width of transistor Q53 used in the GTL must be 800μm. Thus, there was the problem that the chip area is significantly increased when two types of output buffer circuits are internally provided with respective transistors used for a LVTTL and a GTL.

SUMMARY OF THE INVENTION

An object of the present invention is to provide an output buffer circuit that can correspond to two types of interfaces and that can have the chip area reduced.

An output buffer circuit according to an aspect of the present invention is commonly used for first and second interfaces. The output buffer circuit includes a first output transistor connected to a first power supply voltage, a second output transistor connected to a first output transistor, and a connect circuit for connecting the second output transistor to a second power supply voltage when the output buffer circuit is used for the first interface, and for connecting the second output transistor to the first supply voltage when the output buffer circuit is used for the second interface.

According to the above structure, the first output transistor and the second output transistor are connected in series between the first power supply voltage and the second power supply voltage to be used for the first interface. When the output buffer circuit is used for the second interface, the first and second output transistors are connected in parallel, and one end of each output transistor is connected to the first power supply voltage. Since the first and second output transistors can be commonly shared for first and second interfaces, the chip area in which an output buffer circuit is formed can be reduced. It is possible to correspond to both LVTTL and GTL interfaces.

An output buffer circuit according to another aspect of the present invention is commonly used for first and second interfaces. The output buffer circuit includes a first output transistor having one end connected to a first power supply voltage, a pad supplied with a second power supply voltage when used for the first interface, and supplied with a first power supply voltage when used as the second interface, and a second output transistor having one end connected to the first output transistor and the other end receiving one of the first and second power supply voltages according to the level of the voltage supplied to the pad.

According to the above-described structure, the first and second output transistors can be commonly shared for the first and second interfaces by setting the voltage applied to the pad at a predetermined level. Therefore, the chip area in which the output buffer circuit is formed can be reduced significantly. Furthermore, the output buffer circuit can be switched for the first and second interfaces according to the voltage applied to the pad. Therefore, switching between the first and second interfaces can be carried out easily.

An output buffer circuit according to a further aspect of the present invention is used for first and second interfaces. The output buffer circuit includes a first pull down output transistor, a second pull down output transistor, a first pull up output transistor, and a wiring connecting the first pull down transistor and the first pull up output transistor in series when used for the first interface, and connecting the first pull down output transistor and the second pull down output transistor in parallel when used for the second interface.

According to the above structure, the first pull down output transistor and the first pull up output transistor are connected in series in the wiring step, when used for the first interface. The first pull down output transistor and the second pull down output transistor are connected in parallel when used for the second interface. Therefore, the first pull down output transistor can be commonly used for the first and second interfaces. Also, the output buffer circuit can be shared for the first and second interfaces by switching the connection of each output transistor by the wiring. Therefore, the output buffer circuit can be commonly shared for two interfaces, and the area of the chip in which the output buffer circuit is formed can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11 (a)–11(c) are a timing chart for describing the operation of the output buffer circuit of FIG. 10.

FIG. 12 is a circuit diagram showing a structure of a conventional GTL interface output buffer circuit.

FIG. 13 shows a structure of a system employing the output buffer circuit of FIG. 12.

DESCRIPTION OF THE PREFERRED EMBODIMENTS

Figure 1:
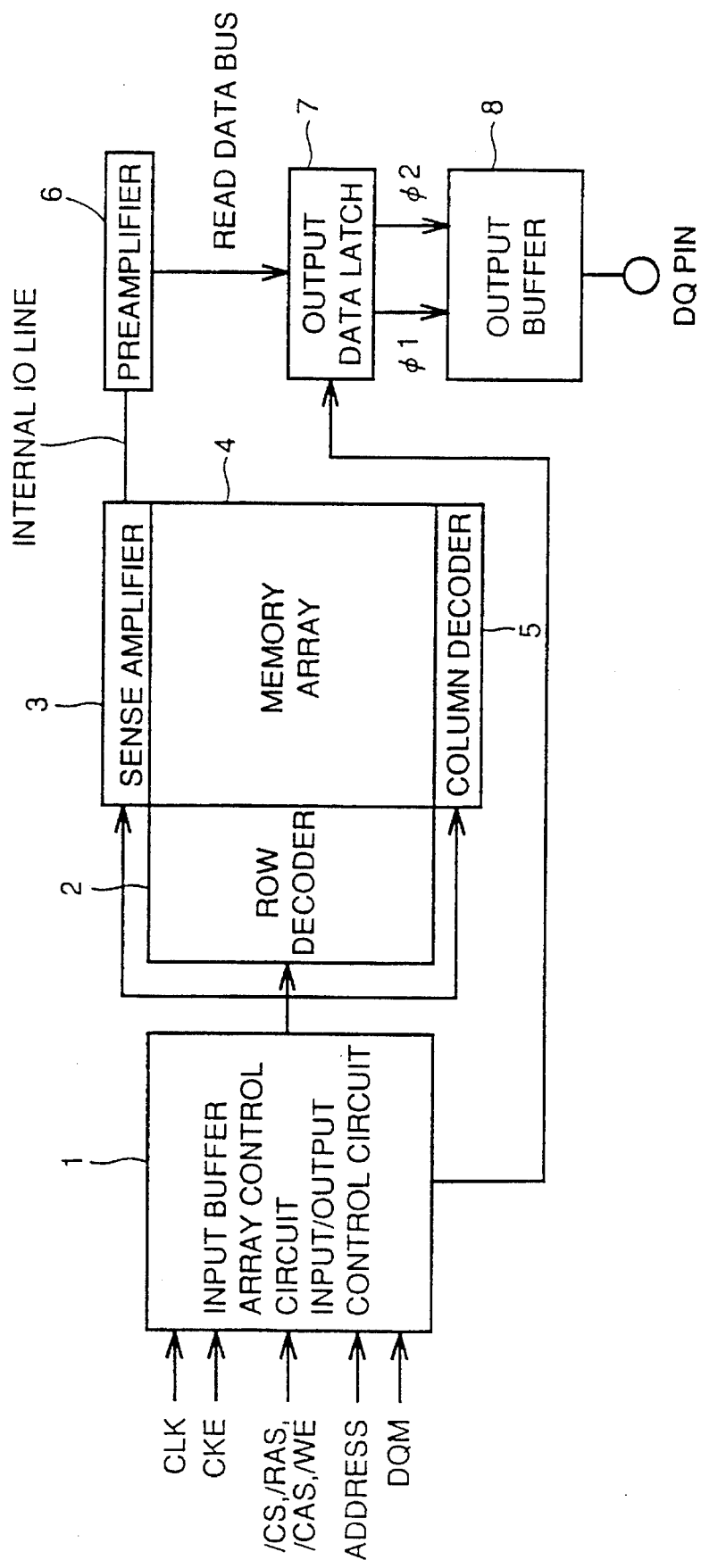
FIG. 1 is a block diagram showing a structure of an SDRAM using an output buffer circuit in which the present invention is applied.

FIG. 1 is a block diagram showing a structure of an SDRAM (Synchronous Dynamic Random Access Memory) using an output buffer circuit in which the present invention is applied. The output buffer circuit according to the present invention is applicable, not only to the above-described SDRAM, but also to other semiconductor devices using two types of interfaces.

Referring to FIG. 1, an SDRAM includes an output buffer, an array control circuit, an input/output control circuit 1, a row decoder 2, a sense amplifier 3, a memory array 4, a column decoder 5, a preamplifier 6, an output data latch 7, and an output buffer 8.

Predetermined clock signals CLK and CKE, a chip select signal /CS, a row address strobe signal /RAS, a column address strobe signal /CAS, a write enable signal /WE ("/" indicates a low active signal), address signals Address indicating the row and column addresses, and input data DQM are applied to the input buffer, the array control circuit, and input/output control circuit 1. Regarding the address signal Address, a row address signal is applied to row decoder 2, and a column address signal is applied to column decoder 5.

Row decoder 2 responds to a row address signal to select a predetermined word line in memory array 4. Column decoder 5 responds to a column address signal to select a predetermined bit line pair. Data of a memory cell connected to the selected word line and bit line pair is amplified by sense amplifier 3 to be applied to preamplifier 6 via an internal IO line.

The data is further amplified at preamplifier 6 to be applied to an output data latch 7 via a read data bus. The input data is latched at output data latch 7. When the latched data is H, output signal φ1 of an H level and output signal φ2 of an L level are provided to output buffer 8. When the latched data is L, an output signal φ1 of an L level and an output signal φ2 of an H level is provided. Output signals φ1 and φ2 of both the L level are provided in operations other than the read operation. Output buffer 8 provides a predetermined output signal via a DQ pin according to the level of the applied output signals φ1 and φ2.

An output buffer circuit according to a first embodiment of the present invention will be described hereinafter.

Figure 2:
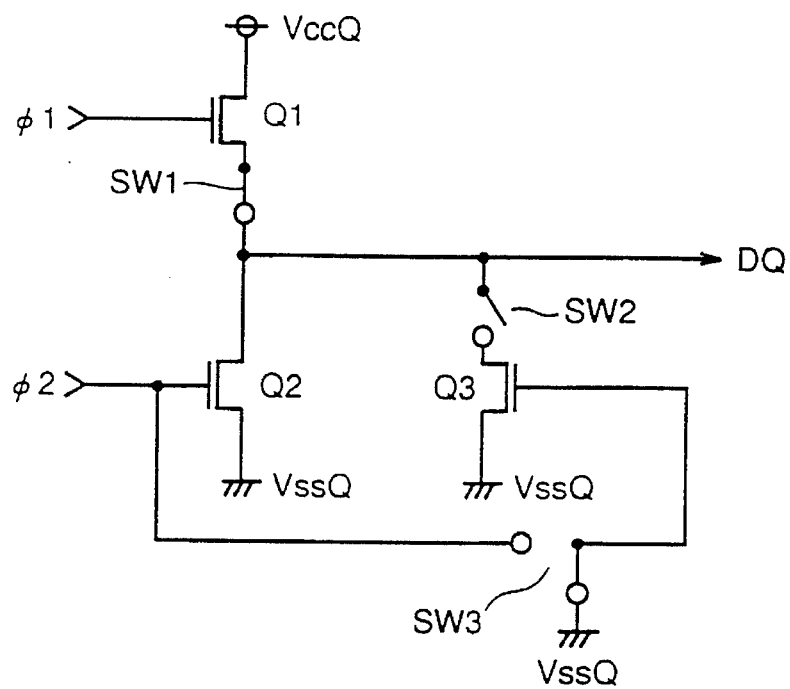
FIG. 2 is a circuit diagram showing a structure of an output buffer circuit according to a first embodiment of the present invention corresponding to a LVTTL.
Figure 3:
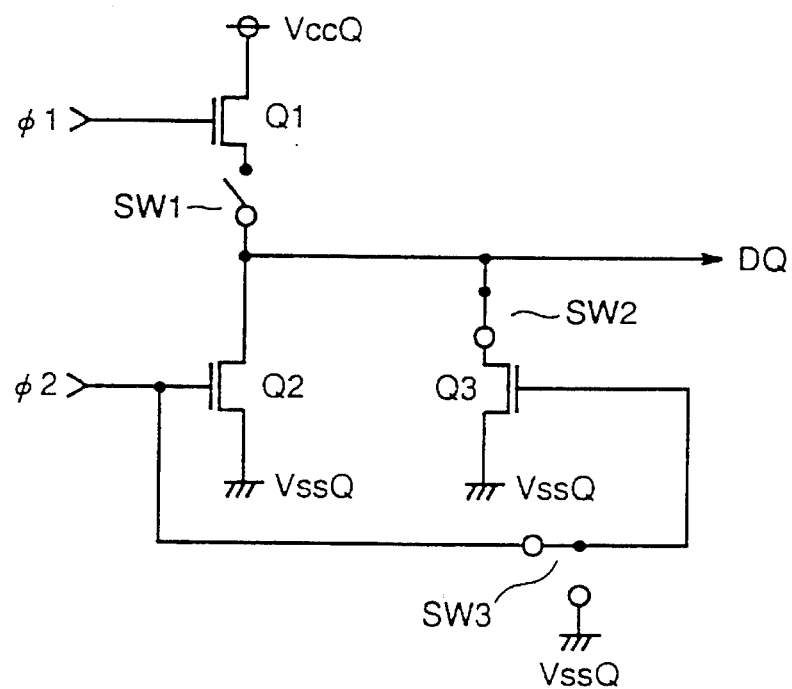
FIG. 3 is a circuit diagram showing a structure of an output buffer circuit according to the first embodiment of the present invention corresponding to a GTL.

Referring to FIGS. 2 and 3, an output buffer circuit includes n channel MOS transistors Q1–Q3, and switches SW1–SW3.

Transistor Q1 is connected to an output power supply voltage $v_{cc}Q$ and switch SW1. Input signal φ1 is applied to the gate of transistor Q1. Transistor Q2 is connected to an output ground voltage $v_{ss}Q$ and switch SW1. Input signal φ2 is applied to the gate of transistor Q2. Transistor Q3 is connected to output ground voltage $v_{ss}Q$ and to transistor Q2 via switch SW2. The gate of transistor Q3 is connected to switch SW3. Switch SW3 is connected to a signal line transmitting input signal φ2 and output ground voltage $v_{ss}Q$.

According to the above-described structure, switch SW1 controls the connection of transistors Q1 and Q2. Switch SW2 controls the connection of transistors Q2 and Q3. Switch SW3 controls the signal applied to the gate of transistor Q3.

Figure 10:
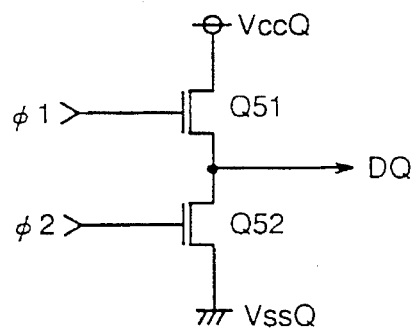
FIG. 10 is a circuit diagram showing a structure of a conventional TTL and LVTTL interface output buffer circuit.

The LVTTL correspondence will be described with reference to FIG. 2. In a LVTTL, switch SW1 is turned on, switch SW2 is turned off, and switch SW3 connects the gate of transistor Q3 with output ground voltage $v_{ss}Q$. Therefore, transistors Q1 and Q2 are connected in series between output power supply voltage $v_{cc}Q$ and output ground voltage $v_{ss}Q$. In contrast, transistor Q3 is disconnected from transistors Q1 and Q3. Transistor Q3 attains an off state since output ground voltage $v_{ss}Q$ is applied to the gate thereof. Under the state shown in FIG. 2, the output buffer circuit has a structure similar to that of the LVTTL interface output buffer circuit of FIG. 10, and carries out an operation similar to that described with reference to FIG. 11.

An output buffer circuit corresponding to a GTL will be described with reference to FIG. 3. As shown in FIG. 3, switch SW1 is off, switch SW2 is on, and switch SW3 provides input signal φ2 to the gate of transistor Q3. Therefore, transistors Q2 and Q3 are arranged in parallel to form an open drain. Here, the gate width of each of transistors Q1–Q3 is set to 400 μm, for example. Therefore, the gate width of transistors Q2 and Q3 becomes the total of 800 μm, resulting in a structure similar to that of the GTL interface output buffer circuit shown in FIG. 12. The operation thereof is also similar.

Thus, by changing the connection state of switches SW1–SW3, transistor Q2 can be commonly shared for both the LVTTL and the GTL, so that the chip area in which the output buffer circuit is formed can be reduced.

A specific layout of the output buffer circuit of the above-described structure will be described hereinafter with reference to FIG. 4.

Figure 4:
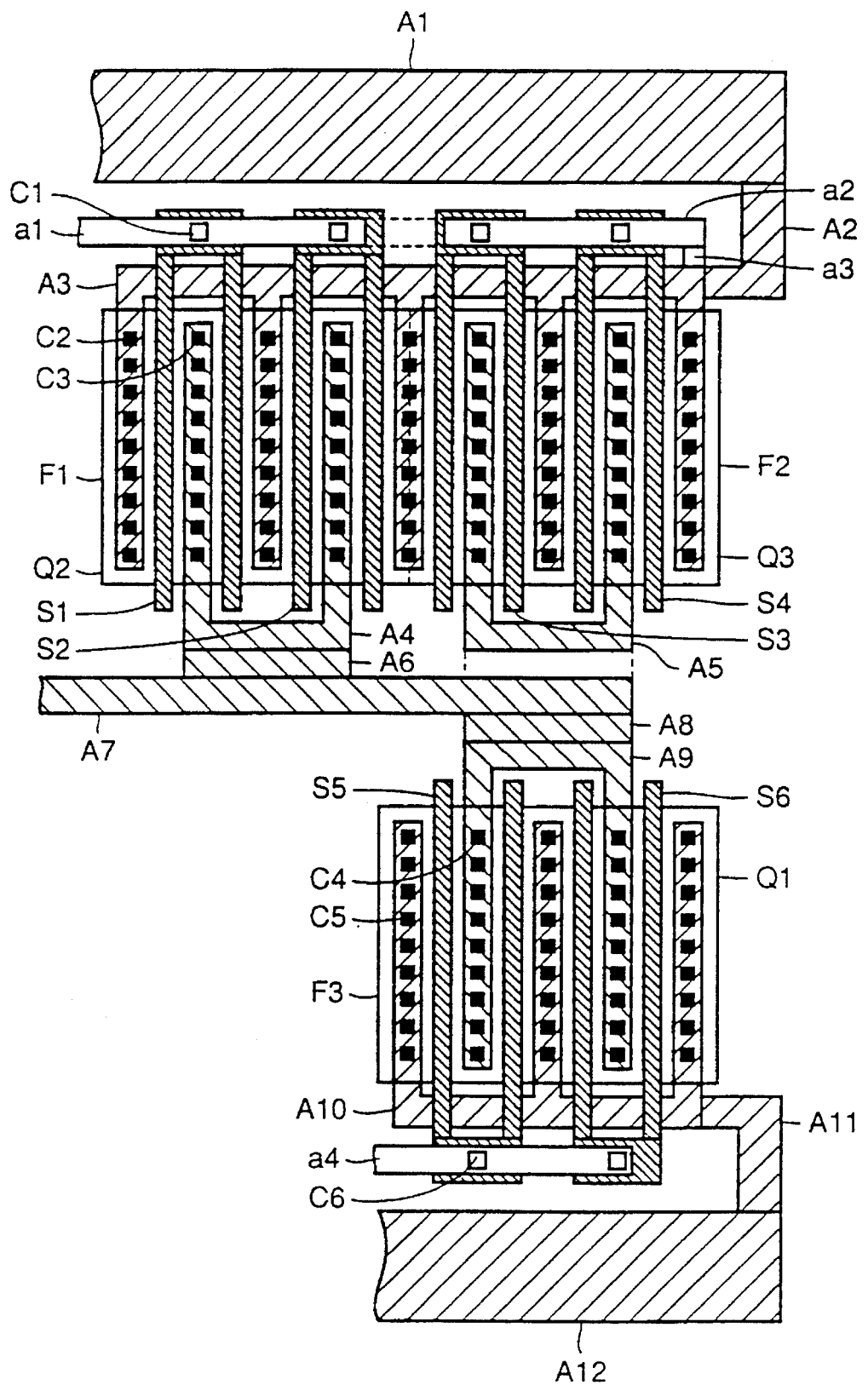
FIG. 4 shows a specific layout of the output buffer circuit of FIG. 2.

Referring to FIG. 4, an output buffer circuit includes first aluminum wirings A1–A12, second aluminum wirings a1–a3, fields F1 and F2, polysilicon gates S1–S6, contacts C1 and C6 of the second aluminum wiring and the polysilicon gate, and contacts C2–C5 of the first aluminum wiring and the field.

Output ground voltage $V_{ss}Q$ is supplied to first aluminum wiring A1 which is connected to first aluminum wiring A3 via first aluminum wiring A2. First aluminum wiring A3 is connected to field F1 via a plurality of contacts C2. Input signal φ2 is supplied to second aluminum wiring a1 which is connected to polysilicon gates S1 and S2 via contact C1. Field F1 is connected to first aluminum wiring A4 via contact C3. First aluminum wiring A4 is connected to first aluminum wiring A7 via first aluminum wiring A6. First aluminum wiring A7 transmits output signal DQ.

According to the above-described structure, transistor Q2 shown in FIGS. 2 and 3 is formed by field F1 and polysilicon gates S1 and S2. More specifically, four transistors are arranged in parallel. The gate width of each transistor is 100 μm, for example. The sum thereof is equal to a transistor having a gate width of 400 μm. Thus, transistor Q2 shown in FIGS. 2 and 3 is formed.

First aluminum wiring A3 is connected to second aluminum wiring a2 via second aluminum wiring a3. Second aluminum wiring a2 is connected to polysilicon gates S3 and S4 via contact C1. Furthermore, second aluminum wiring a2 is isolated from second aluminum wiring a1, so that input signal φ2 is not transmitted to second aluminum wiring a2. Output ground voltage $V_{ss}Q$ is supplied to second aluminum wiring a2 via second aluminum wiring a3. First aluminum wiring A3 is connected to field F2 via contact C2. Field F2 is connected to first aluminum wiring A5 via contact C3.

According to the above structure, transistor Q3 shown in FIG. 2 is formed including field F2 and polysilicon gates S3 and S4. More specifically, four transistors are arranged in parallel similar to transistor Q2. The gate width of each transistor is 100 μm, for example. The sum thereof is equal to a transistor having a gate width of 400 μm, so that transistor Q3 is formed.

Output power supply voltage $V_{cc}Q$ is supplied to first aluminum wiring A12. First aluminum wiring A12 is connected to first aluminum wiring A10 via first aluminum wiring A11. First aluminum wiring A10 is connected to field F3 via a plurality of contacts C5. Input signal φ1 is transmitted to second aluminum wiring a4 which is connected to polysilicon gates S5 and S6 via contact C6. Field F3 is connected to first aluminum wiring A9 via a plurality of contacts C4. First aluminum wiring A9 is connected to first aluminum wiring A7 via first aluminum wiring A8. By the above-described structure, transistor Q1 shown in FIG. 2 is formed by field F3 and polysilicon gates S5 and S6. More specifically, the four transistors are arranged in parallel, wherein the gate width of each transistor is 100 μm, for example. The sum thereof becomes equal to a transistor having a gate width of 400 μm. Thus, transistor Q1 shown in FIGS. 2 and 3 is formed.

When the output buffer circuit of FIG. 4 is used for a GTL, second aluminum wiring al and second aluminum wiring a2 are connected. Second aluminum wiring a3 and first aluminum wiring A8 are removed. First aluminum wiring A5 and first aluminum wiring A7 are connected. By such a connection, an output buffer circuit having a structure similar to that of the output buffer circuit of FIG. 3 can be formed.

Connection and disconnection of each wiring can easily be modified by switching the aluminum wiring mask at the manufacturing stage. Modification can easily be carried out by a metal mask option or the like. Thus, the manufacturing cost can be reduced. Furthermore, since switches SW1–SW3 are implemented by switching the connection state of each wiring, there is no surplus area. Thus, the area penalty is zero. Also, the chip area can further be reduced.

An output buffer circuit according to a second embodiment of the present invention will be described hereinafter with reference to FIGS. 5 and 6.

Figure 5:
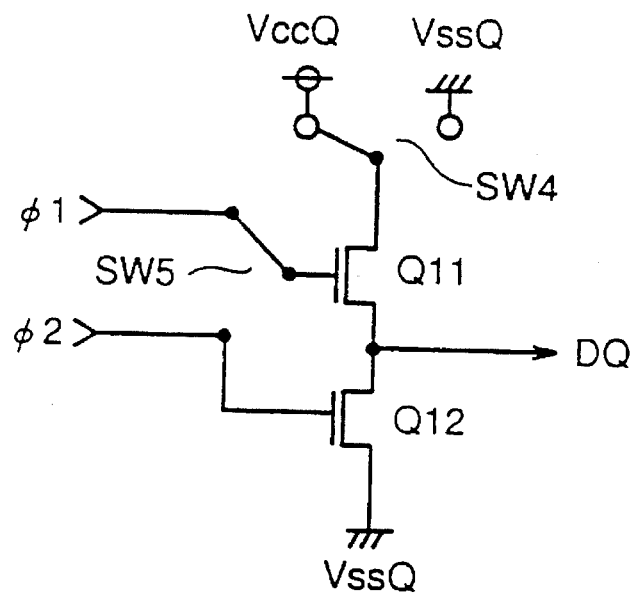
FIG. 5 is a circuit diagram showing a structure of an output buffer circuit according to a second embodiment of the present invention corresponding to a LVTTL.
Figure 6:
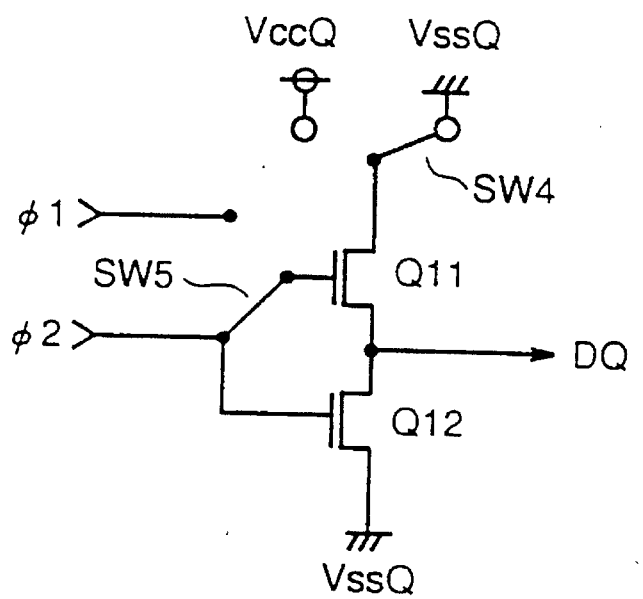
FIG. 6 is a circuit diagram showing a structure of an output buffer circuit according to the second embodiment of the present invention corresponding to a GTL.

Referring to FIGS. 5 and 6, an output buffer circuit includes n channel MOS transistors Q11 and Q12, and switches SW4 and SW5. Transistor Q11 is connected to output power supply voltage $v_{cc}Q$ and output ground voltage $v_{ss}Q$ via switch SW4. Switch SW4 connects either output power supply voltage $v_{cc}Q$ or output ground voltage $v_{ss}Q$ with transistor Q11. Transistor Q11 has its gate connected to input signals φ1 and φ2 via switch SW5. Switch SW5 applies either input signals φ1 or φ2 to the gate of transistor Q11. Transistor Q12 is connected to transistor Q11 and output ground voltage $v_{ss}Q$. Input signal φ2 is supplied to the gate of transistor Q12. Output signal DQ is provided from the connection of transistors Q11 and Q12.

An output buffer circuit corresponding to a LVTTL will be described with reference to FIG. 5. Switch SW4 connects transistors Q11 and output power supply voltage $V_{cc}Q$. Switch SW5 provides input signal φ1 to the gate of transistor Q11. Therefore, input signals φ1 and φ2 are applied to each gate of transistors Q11 and Q12, respectively. Transistors Q11 and Q12 are connected in series between output power supply voltage $V_{cc}Q$ and output ground voltage $V_{ss}Q$. By this structure, the output buffer circuit of FIG. 5 has a structure similar to that of the LVTTL interface output buffer circuit shown in FIG. 10. The operation is also similar.

An output buffer corresponding to a GTL will be described with reference to FIG. 6. Switch SW4 connects output ground voltage $V_{ss}Q$ and transistor Q11. Switch SW5 transmits input signal φ2 to the gate of transistor Q11. Input signal φ2 is applied to each gate of transistors Q11 and Q12. Transistors Q11 and Q12 are connected in parallel to form an open drain. The gate width of each of transistors Q11 and Q12 is set to 400 μm respectively. Therefore, the gate width of transistors Q11 and Q12 is equal to a transistor having a gate width of 800 μm. Thus, the output buffer circuit of FIG. 6 has a structure similar to that of the GTL interface output buffer circuit of FIG. 12. The operation thereof is also similar.

Thus, transistors Q11 and Q12 are commonly shared for a LVTTL and a GTL. The chip area can further be reduced in comparison with that of the first embodiment.

A specific layout of the output buffer circuit of FIG. 5 will be described with reference to FIG. 7.

Figure 7:
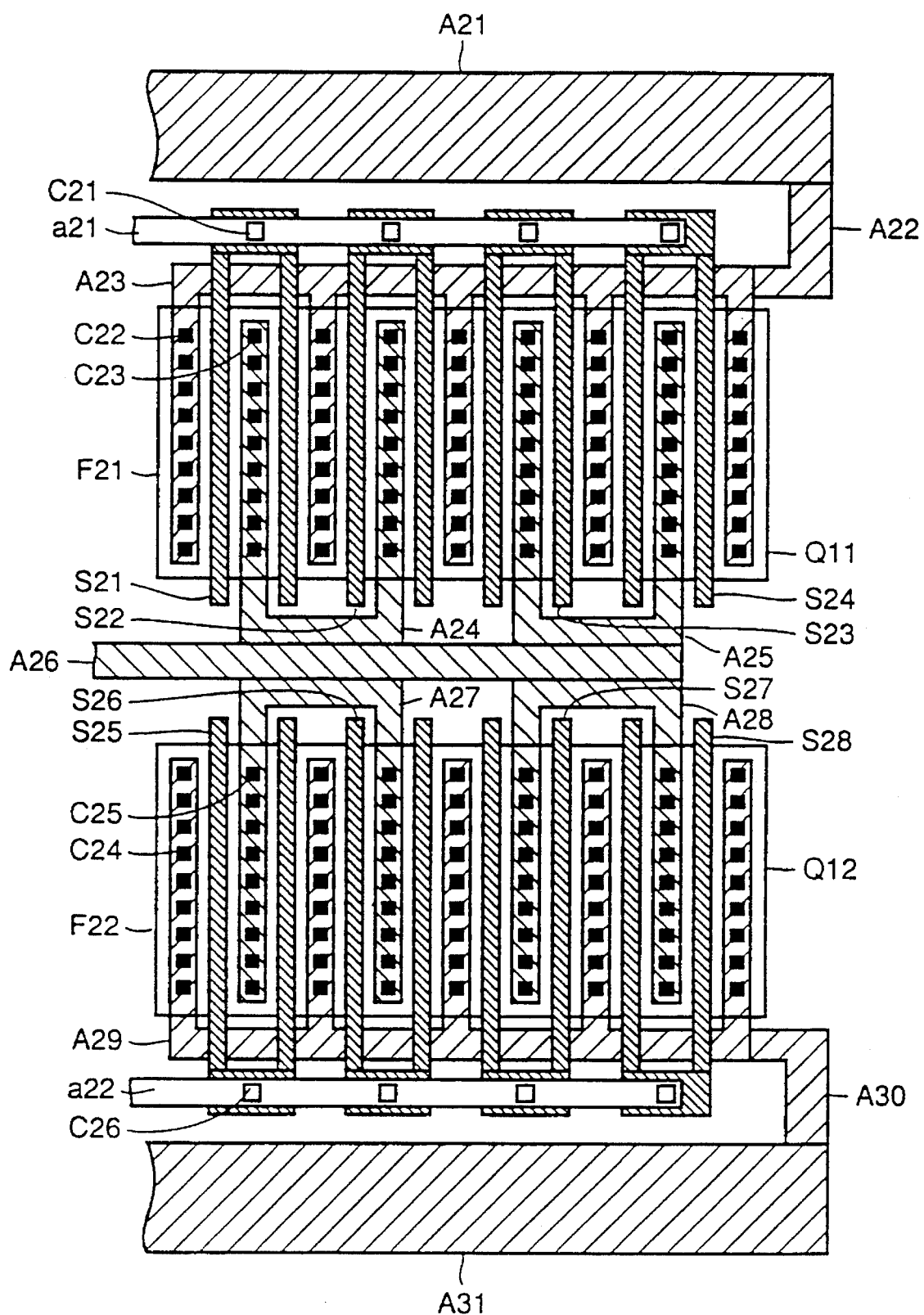
FIG. 7 shows a specific layout of the output buffer circuit of FIG. 5.

Referring to FIG. 7, an output buffer circuit includes first aluminum wirings A21–A31, second aluminum wirings a21 and a22, fields F21 and F22, polysilicon gates S21–S28, contacts C21 and S26 between a second aluminum wiring and a polysilicon gate, and contacts C22–C24 between a first aluminum wiring and a field.

An output buffer circuit corresponding to a LVTTL will be described first. Output ground voltage $V_{ss}Q$ is supplied to first aluminum wiring A21 which is connected to first aluminum wiring A23 via first aluminum wiring A22. First aluminum wiring A23 is connected to field F21 via contact C22. Input signal φ2 is provided to second aluminum wiring a21 which is connected to polysilicon gates S21–S24 via contact C21. Field F21 is connected to first aluminum wirings A24 and A25 via contact C23. Second aluminum wirings a24 and a25 are connected to second aluminum wiring a26. Second aluminum wiring a26 transmits an output signal DQ.

By such a structure, transistor Q11 shown in FIG. 5 is formed by field F21 and polysilicon gates S21–S24. More specifically, eight transistors are arranged in parallel. The gate width of each transistor is 50 μm, for example, so that a transistor Q11 having a gate width of 400 μm as a total is formed.

Output power supply voltage $V_{cc}Q$ is supplied to first aluminum wiring A31 which is connected to first aluminum wiring A29 via first aluminum wiring A30. First aluminum wiring A29 is connected to field F22 via contact C24. Input signal φ1 is transmitted to second aluminum wiring a22 which is connected to polysilicon gates S25–S28 via contact C26. Field F22 is connected to first aluminum wirings A27 and A28 via contact C25. First aluminum wirings A27 and A28 are connected to first aluminum wiring A26.

By such a structure, transistor Q12 shown in FIG. 5 is formed of field F22 and polysilicon gates S25–S28. More specifically, eight transistors are arranged in parallel. With each transistor having a gate width of 50 μm, transistor Q12 having a gate width of 400 μm is formed.

In a GTL-corresponding output buffer circuit, output ground voltage $V_{ss}Q$ is supplied to first aluminum wiring A31. Input signal φ2 is applied to second aluminum wiring a22. As a result, an output buffer circuit shown in FIG. 6 can be formed.

According to the output buffer circuit of FIG. 7, one circuit can be commonly used for a LVTTL and a GTL by modifying the definition of each wiring instead of providing switches SW4 and SW5 shown in FIGS. 5 and 6, and modifying the input voltage and signals. Therefore, the area required for arranging switches SW4 and SW5 is not necessary. Thus, the chip area can further be reduced. The above-described modification can be easily enabled by a metal mask option or the like similar to that for the output buffer circuit of FIG. 5.

An input/output buffer circuit according to a third embodiment of the present invention will be described with reference to the circuit diagram of FIG. 8.

Figure 8:
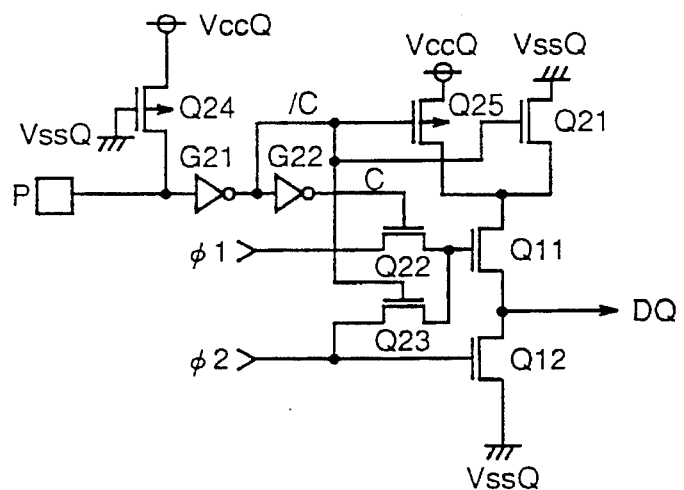
FIG. 8 is a circuit diagram showing a structure of an output buffer circuit according to a third embodiment of the present invention.

Referring to FIG. 8, an output buffer circuit includes a pad P, p channel MOS transistors Q24 and Q25, n channel MOS transistors Q21–Q23, Q11, Q12, and inverters G21 and G22.

Pad P is connected to transistor Q24 and inverter G21. Transistor Q24 is connected to output power supply voltage $V_{cc}Q$. Output ground voltage $V_{ss}Q$ is applied to the gate of transistor Q24. Transistor Q24 is connected to output power supply voltage $V_{cc}Q$ and transistor Q11. A control signal /C ("/" indicates an inversion signal) provided from inverter G21 is applied to the gate of transistor Q25. Transistor Q21 is connected to output ground voltage $V_{ss}Q$ and transistor Q11. Control signal /C from inverter G21 is applied to the gate of transistor Q21. Inverter G22 is connected to inverter G21. Inverter G22 inverts an input control signal /C to output a control signal C. Transistor Q11 is connected to transistor Q12. Input signal $\phi1$ is applied to the gate of transistor Q11 via transistor Q22. Input signal $\phi2$ is also applied to transistor Q11 via transistor Q23. Control signal C is applied to the gate of transistor Q22. Control signal /C is applied to the gate of transistor Q23. Transistor Q12 is connected to output ground voltage $V_{ss}Q$. Input signal $\phi2$ is applied to the gate of transistor Q12. Output signal DQ is provided from the node of transistors Q11 and Q12.

The operation of the output buffer circuit of the above structure will be described hereinafter. First the operation corresponding to a LVTTL will be described. Pad P is set to an open state. Output ground voltage $V_{ss}Q$ supplied to the gate of transistor Q24 causes transistor Q24 to be turned on, and a signal of an H level is applied to inverter G21. Therefore, control signal /C output from inverter G21 attains an L level, and control signal C output from inverter G22 attains an H level. As a result, transistor Q25 is turned on, and transistors Q21 and Q23 are turned off. Furthermore, transistor Q22 is turned on. Therefore, output power supply voltage $V_{cc}Q$ is supplied to transistor Q11. Input signal $\phi1$ is applied to the gate of transistor Q11. Therefore, the output buffer circuit of FIG. 8 has a structure similar to that of the output buffer circuit of FIG. 5. The operation thereof is also similar.

The operation corresponding to a GTL will be described hereinafter. Pad P is bonded to a $V_{ss}$ lead, whereby output ground voltage $V_{ss}Q$ is supplied. As a result, a signal of an L level is applied to inverter G21, whereby control signal /C attains an H level. Control signal /C is inverted by inverter G22, and control signal C attains an L level. Here, transistor Q25 is turned off and transistors Q21 and Q23 are turned on. Transistor Q22 is turned off. Therefore, output ground voltage $V_{ss}Q$ is supplied to transistor Q11. Input signal $\phi2$ is supplied to the gate of transistor Q11. As a result, the output buffer circuit of FIG. 8 has a structure similar to that of the output buffer circuit of FIG. 6. The operation is also similar.

By such a structure, the output buffer circuit of FIG. 8 can correspond to a LVTTL and a GTL by providing a predetermined voltage to pad P. As a result, modification for a LVTLL and a GTL is easily enabled.

Although switching between a LVTTL and a GTL is carried out by setting pad P to a predetermined state in the above-described embodiment, this switching may be carried out in response to an input predetermined control signal.

An output buffer circuit according to a fourth embodiment of the present invention will be described hereinafter with reference to FIG. 9.

Figure 9:
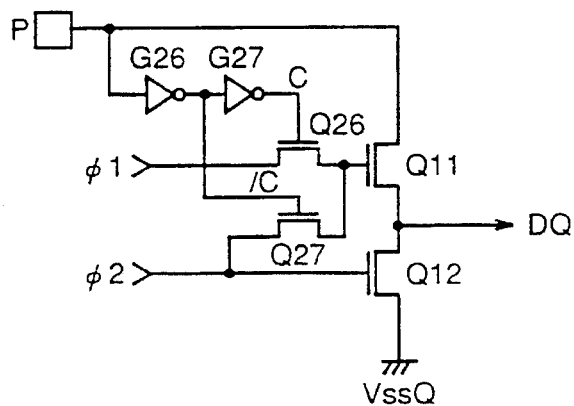
FIG. 9 is a circuit diagram showing a structure of an output buffer circuit according to a fourth embodiment of the present invention.

Referring to FIG. 9, an output buffer circuit includes a pad P, inverters G26 and G27, and n channel MOS transistors Q26, Q27, Q11 and Q12. Transistor Q11 is connected to pad P. Pad P is connected to inverter G26, which in turn is connected to inverter G27. Input signal $\phi1$ is applied to the gate of transistor Q11 via transistor Q26. Control signal C output from inverter G27 is applied to the gate of transistor Q26. Input signal $\phi2$ is applied to the gate of transistor Q11 via transistor Q27. Control signal /C output from inverter G26 is applied to the gate of transistor Q27. Transistor Q12 is connected to transistor Q11 and output ground voltage $V_{ss}Q$. Input signal $\phi2$ is applied to the gate of transistor Q12. Output signal DQ is provided from the node between transistors Q11 and Q12.

The operation of the above output buffer circuit will be described hereinafter. First, a LVTTL version will be described. Pad P is bonded to a $V_{cc}$ lead, and output power supply voltage $V_{cc}Q$ is supplied. The signal input from pad P is inverted by inverter G26, and control signal /C attains an L level. The output signal of inverter G26 is inverted by inverter G27, and control signal C attains an H level. Therefore, transistor Q26 is on and transistor Q27 is off. As a result, output power supply voltage $V_{cc}Q$ is supplied to transistor Q11. Input signal $\phi1$ is applied to the gate of transistor Q11. Thus, the output buffer circuit of FIG. 9 has a structure similar to that of the output buffer circuit of FIG. 5. The operation thereof is also similar.

Next, a GTL version will be described. Pad P is bonded to a $V_{ss}$ lead, and output ground voltage $V_{ss}Q$ is supplied. The signal applied from pad P is inverted by inverter G26, and control signal /C attains an H level. The output signal from inverter G26 is inverted by inverter G27, and control signal C attains an L level. As a result, transistor Q26 is off and transistor Q27 is on. Therefore, output ground voltage $V_{ss}Q$ is supplied to transistor Q11. Input signal $\phi2$ is applied to the gate of transistor Q11. Thus, the output buffer circuit of FIG. 9 has a structure similar to that of the output buffer circuit of FIG. 6, and a similar operation can be carried out.

The same circuit can be used for a LVTTL and a GTL by supplying a predetermined voltage to pad P in the present fourth embodiment. The circuit structure according to the fourth embodiment is further simplified than that of the third embodiment of FIG. 8, so that the chip area for forming an output buffer circuit can further be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output buffer circuit commonly used for first and second interfaces, comprising:

a first output transistor connected to a first power supply voltage, a second output transistor connected to said first output transistor, and voltage supply connect means for connecting said second output transistor to a second power supply voltage when used for said first interface, and for connecting said second output transistor to said first power supply voltage when used for said second interface.

2. The output buffer circuit according to claim 1, further comprising:

select signal output means for providing a select signal to select one of said first and second interfaces, wherein said voltage supply connect means connects one of said first and second power supply voltages to said second output transistor according to said select signal.

3. The output buffer circuit according to claim 2, wherein said select signal output means comprises a pad to which a select voltage is supplied for selecting one of said first and second interfaces, a first PMOS transistor having one end connected to said pad and the other end receiving said second power supply voltage, and a gate receiving said first power supply voltage, and a first inverter having an input end connected to one end of said first PMOS transistor, wherein said voltage supply connect means comprises a second PMOS transistor having one end receiving said second power supply voltage, and a gate receiving an output of said first inverter, and a first NMOS transistor having one end receiving said first power supply voltage and a gate receiving an output of said first inverter, said second output transistor including a second NMOS transistor having one end connected to the other end of said second PMOS transistor and the other end of said first NMOS transistor, said first output transistor including a third NMOS transistor having one end connected to the other end of said second NMOS transistor and the other end receiving said first power supply voltage.

4. The output buffer circuit according to claim 3, wherein said output buffer circuit receives first and second input signals when used for said first interface, and receiving said second input signal when used for said second interface, said output buffer circuit further comprising input signal switch means for applying said first input signal to a gate of said second NMOS transistor when used for said first interface, and applying said second input signal to a gate of said second NMOS transistor when used for said second interface.

5. The output buffer circuit according to claim 4, wherein said input signal switch means comprises a second inverter having an input end connected to an output end of said first inverter, a fourth NMOS transistor having one end receiving said first input signal, the other end connected to a gate of said second NMOS transistor, and a gate receiving an output of said second inverter, and a fifth NMOS transistor having one end receiving said second input signal, the other end connected to a gate of said second NMOS transistor, and a gate receiving an output of said first inverter, wherein said second input signal is applied to a gate of said third NMOS transistor.

6. The output buffer circuit according to claim 2, wherein said voltage supply connect means comprises a pad connected to said second output transistor, for receiving said second power supply voltage when used for said first interface, and receiving said first power supply voltage when used for said second interface.

7. The output buffer circuit according to claim 6, wherein said output buffer circuit receives first and second input signals when used for said first interface, and receives said second input signal when used for said second interface, said output buffer circuit further comprising input signal switch means for applying said first input signal at a gate of said second NMOS transistor when used for said first interface, and applying said second input gate at a gate of said second NMOS transistor when used for said second interface.

8. The output buffer circuit according to claim 7, wherein said input signal switching means comprises, a first inverter having an input end connected to said pad, a second inverter having an input end connected to an output end of said first inverter, a fourth NMOS transistor having one end receiving said first input signal, the other end connected to a gate of said second output transistor, and a gate receiving an output of said second inverter, and a second NMOS transistor having one end receiving said second input signal, the other end connected to a gate of said second output transistor, and a gate receiving an output of said first inverter, wherein said second input signal is applied to a gate of said first output transistor.

9. The output buffer circuit according to claim 1, wherein said voltage supply connect means comprises a predetermined wiring.

10. The output buffer circuit according to claim 9, wherein said output buffer circuit receives first and second input signals when used for said first interface, and receives said second input signal when used for said second interface, said output buffer circuit further comprising input signal switching means for applying said first input signal to a gate of said second output transistor when used for said first interface, and applying said second input signal to a gate of said second output transistor when used for said second interface.

11. The output buffer circuit according to claim 10, wherein said input signal switching means comprises a predetermined input signal wiring.

12. The output buffer circuit according to claim 11, wherein said wiring and input wiring comprise an aluminum wiring.

13. The output buffer circuit according to claim 1, wherein said first interface includes a LVTTL interface, said second interface includes a GTL interface, said first power supply voltage includes a ground voltage, and said second power supply voltage includes a positive power supply voltage.

14. An output buffer circuit commonly used for first and second interfaces, comprising:

a first output transistor having one end connected to a first power supply voltage, a pad to which a second power supply voltage is supplied when used for said first interface, and to which said first power supply voltage is supplied when used for said second interface, and a second output transistor having one end connected to the other end of said first output transistor, the other end receiving one of said first and second power supply voltages according to the level of the voltage supplied to said pad.

15. The output buffer circuit according to claim 14, said output buffer circuit further comprising input signal switching means for switching an input signal applied to the gates of said first and second output transistors according to the level of the voltage supplied to said pad.

16. The output buffer circuit according to claim 15, wherein said input signal switching means further comprises a first PMOS transistor having one end connected to said pad, the other end receiving said second power supply voltage, and a gate receiving said first power supply voltage, and a first inverter having an input end connected to one end of said first PMOS transistor, a second PMOS transistor having one end receiving said second power supply voltage, and a gate receiving an output of said first inverter, and a first NMOS transistor having one end receiving said first power supply voltage, and a gate receiving an output of said first inverter, said second output transistor including a second NMOS transistor having one end connected to the other end of said second PMOS transistor and the other end of said first NMOS transistor, said first output transistor including a third NMOS transistor having one end connected to another end of said second NMOS transistor, and another end receiving said first power supply voltage.

17. The output buffer circuit according to claim 15, wherein said input signal switching means comprises a first inverter having an input end connected to said pad, a second inverter having an input end connected to an output end of said first inverter, a first NMOS transistor having one end receiving a first input signal, the other end connected to a gate of said second output transistor, and a gate receiving an output of said second inverter, a second NMOS transistor having one end receiving a second input signal, the other end connected to a gate of said second output transistor, and a gate receiving an output of said first inverter, wherein said second input signal is applied to a gate of said third NMOS transistor.

18. The output buffer circuit according to claim 14, wherein said first interface includes a LVTTL interface, said second interface includes a GTL interface, said first power supply voltage includes a ground voltage, and said second power supply voltage includes a positive power supply voltage.

19. An output buffer circuit commonly used for first and second interfaces, comprising:

a first pull down output transistor, a second pull down output transistor, a first pull up output transistor, and a wiring for connecting said first pull down output transistor and said first pull up output transistors in series when used for said first interface, and for connecting said first pull down output transistor and said second pull down output transistor in parallel when used for said second interface.

20. The output buffer circuit according to claim 19, wherein said first interface includes a LVTTL interface, said second interface includes a GTL interface, said first power supply voltage includes a ground voltage, and said second power supply voltage includes a positive power supply voltage.

21. The output buffer circuit according to claim 19, wherein said wiring includes an aluminum wiring.

22. A semiconductor device including an output buffer circuit commonly used for first and second interfaces, wherein said output buffer circuit comprises a first output transistor connected to a first power supply voltage, a second output transistor connected to said first output transistor, and power supply connect means for connecting said second output transistor and a second power supply voltage when used for said first interface, and for connecting said second output transistor to said first power supply voltage when used for said second interface.

23. The semiconductor device according to claim 22, wherein said semiconductor device comprises a synchronous dynamic random access memory.

24. The semiconductor device according to claim 23, wherein said first interface includes a LVTTL interface, said second interface includes a GTL interface, said first power supply voltage includes a ground voltage, and said second power supply voltage includes a positive power supply voltage.

* * * * *